US006856215B2

(12) United States Patent
Gurvich et al.

(10) Patent No.: US 6,856,215 B2
(45) Date of Patent: Feb. 15, 2005

(54) SYSTEM AND METHOD FOR ADJUSTING GROUP DELAY

(75) Inventors: Mark Gurvich, Costa Mesa, CA (US); Alex Rabinovich, Cypress, CA (US); Nikolai Maslennikov, Tustin, CA (US); Jianqing He, Cerritos, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 65 days.

(21) Appl. No.: 10/151,835

(22) Filed: May 20, 2002

(65) Prior Publication Data

US 2003/0042979 A1 Mar. 6, 2003

Related U.S. Application Data

(60) Provisional application No. 60/314,840, filed on Aug. 24, 2001.

(51) Int. Cl.[7] ................................................ H01P 9/00
(52) U.S. Cl. ...................... 333/156; 333/139; 333/144; 333/161; 333/214
(58) Field of Search ................................ 333/156, 164, 333/214, 139, 217, 161, 144, 152

(56) References Cited

U.S. PATENT DOCUMENTS

| | | | |
|---|---|---|---|
| 3,699,380 A | | 10/1972 | Mueller ........................ 333/28 |
| 3,906,409 A | | 9/1975 | Whitehouse .................. 333/29 |
| 4,189,690 A | * | 2/1980 | Bock et al. ................... 332/130 |
| 4,197,514 A | | 4/1980 | Kasuga et al. ................ 333/28 |
| 4,367,445 A | | 1/1983 | Dydyk ........................ 333/127 |
| 5,146,192 A | * | 9/1992 | Kondo et al. ................ 333/164 |
| 5,999,077 A | * | 12/1999 | Hammond et al. .......... 336/134 |
| 6,400,237 B1 | * | 6/2002 | Seino ........................... 333/156 |

FOREIGN PATENT DOCUMENTS

| | | |
|---|---|---|
| DE | 2747871 | 5/1979 |
| FR | 2365243 | 4/1978 |

OTHER PUBLICATIONS

Potheycary, N. "Feedforward Linear Amplifiers", Artech House, 1999 ISBN 0–1–58053–022–2.

* cited by examiner

Primary Examiner—Benny Lee
Assistant Examiner—Kimberly Glenn
(74) Attorney, Agent, or Firm—Hogan & Hartson LLP; Paul Heynssens; Peter J. Meza

(57) ABSTRACT

A group delay adjusting circuit. The group delay adjusting circuit comprises an electronically adjustable variable capacitance, and an electronically variable virtual inductor coupled in parallel to the electronically variable capacitance at a node.

11 Claims, 12 Drawing Sheets

SYSTEM AND METHOD FOR ADJUSTING GROUP DELAY

CROSS-REFERENCE TO RELATED APPLICATION

This application claims the benefit of U.S. Provisional Application "A Group Delay Adjusting Circuit" Application No. 60/314,840 filed Aug. 24, 2001, the contents of which are hereby incorporated by reference.

BACKGROUND OF THE INVENTION

Group delay adjuster circuits play a key role in a number of applications which require compensation for group delay, such as feedforward power amplifiers, and the like. In an exemplary feed forward amplifier, a group delay adjusting circuit might be used in loop compensation circuitry such as a phase and gain adjuster. Alternatively, the group delay adjusting circuit may be implemented as a separate functional block prior to the phase and gain adjusting circuit.

In an electrical network transmission without distortion is typically achieved when an amplitude and a group delay response of a network are as close to constant as possible. If an electrical network has a non-constant group delay, group delay compensation in the form of an electric compensation, or group delay adjusting, circuit may be added so that the overall electrical network response is more nearly constant.

As will be appreciated by those skilled in the art the frequency response of a network may be represented as a function of a frequency T, by $F(jT)=A(jT)+B(jT)$ or equivalently as $F(jT)=*F(jT)*e^{jN(T)}$. The magnitude of the amplitude response of the network is defined as $*F(jT)*=[A^2(jT)+B^2(jT)]^{1/2}$. The phase angle of the network is defined as $N(T)=\tan^{-1}[A(jT)/B(jT)]$. The group delay of the network is defined as $\Theta(T)=dN(T)/dT$. Two signals having an equal propagation delay have equal phase verses frequency slopes. Two signals have constant delay when the phase verses frequency slope, or group delay is constant. The group delay response of a the network is the response that is sought to be compensated for with a group delay adjusting circuit so that an overall group delay response for the composite response of the two networks tends to be flattened, and thus compensated for. Feed forward power amplifiers amplify multiple carriers, or groups of frequencies.

Often it is desirable to match the characteristics of signal paths to optimize electrical performance. For a feedforward amplifier to be effective over a wide bandwidth in canceling distortion it is desirable to have cancellation loops with the greatest cancellation possible over the greatest bandwidth possible. For example, in a linear feed forward power amplifier (FFPA), one or more error correcting, or error cancellation, loops are present. In each loop a signal will typically travel through an active signal path present in active circuits and a passive signal path through the passive circuits. Loop cancellation tends to be optimal when signals traveling over the active and passive signal paths tend to have equal amplitude responses, opposite phase responses, and equal group delay.

Compensation is typically provided by a network having inductors and capacitors disposed in it to achieve a compensating response. Inductors are usually difficult to build, and often require trimming and/or adjustment. They are typically implemented for example, by a coil of wire wound on a form, or a spiral of foil disposed upon a substrate or printed circuit board.

SUMMARY OF THE INVENTION

The present invention therefore provides a group delay adjusting circuit. The group delay adjusting circuit comprises an electronically adjustable variable capacitance, and an electronically variable virtual inductor coupled in parallel to the electronically variable capacitance at a node.

In accordance with a further aspect of the present invention a group delay adjusting circuit is provided. The group delay adjusting circuit comprises, a transmission line having an input and an output terminals, a stub matching structure including a virtual inductor having a first terminal coupled to the through main transmission line and a second terminal coupled to ground, and including a first control signal input and a second control signal input. The two signals are used in order to achieve group adjustment function.

In accordance with a further aspect of the present invention, a method of adjusting a group delay adjusting circuit is provided. The method of adjusting a group delay adjusting circuit comprises, applying a capacitive control signal to adjust a first variable capacitance, adjusting the first variable capacitance by applying the capacitive control signal to the first variable capacitance, applying an inductive control signal to a second variable capacitance, and adjusting the second variable capacitance by applying the inductive control signal to the second variable capacitance.

In accordance with still another aspect of the present invention, a group delay adjusting circuit is provided. The group delay adjusting circuit comprises, a means for providing an electronically adjustable variable capacitance, and a means for providing an electronically variable inductance that is coupled in parallel to the means for providing an electronically adjustable capacitance.

In accordance with still another aspect of the present invention, a method of providing group delay adjustment is provided. The method comprises, adjusting a first parallel variable shunt capacitance having a first terminal and a second terminal coupled to a ground, adjusting a second variable shunt capacitance, and rotating the second variable shunt capacitance by coupling the variable shunt capacitance to a first terminal of a series transmission line in which a second terminal of the series transmission line is coupled to the first terminal of the first parallel variable shunt capacitance. Whereby the variable shunt capacitance is transformed into a variable inductance and group delay is adjusted.

Many of the attendant features of this invention will be more readily appreciated as the same becomes better understood by reference to the following detailed description considered in connection with the accompanying drawings.

DESCRIPTION OF THE DRAWINGS

These and other features and advantages of the present invention will be better understood from the following detailed description read in light of the accompanying drawings, wherein.

Like reference numerals are used to designate like parts in the accompanying drawings.

DETAILED DESCRIPTION

The detailed description provided below in connection with the appended drawings is intended as a description of the present embodiments of the invention and is not intended to represent the only forms in which the present invention may be constructed or utilized. The description sets forth the functions of the invention and the sequence of steps for constructing and operating the invention in connection with the illustrated embodiments. However, the same or equivalent functions and sequences may be accomplished by different embodiments that are also intended to be encompassed within the spirit and scope of the invention.

Although the present invention of a group delay adjuster is described and illustrated as being implemented in a cellular telephone feedforward amplifier system, the feedforward system described is provided as an example and not a limitation. As those skilled in the art will appreciate, the present invention is suitable for application in a variety of different types of feed forward amplifiers, radio frequency (RF) circuits, microwave circuits and communications systems.

A cellular telephone system typically utilizes feed forward amplifiers to amplify the signal strength of multiple outgoing (outgoing to one or more cellular telephone handsets) calls. The feed forward amplifier is typically located in a cellular telephone base station equipment shed, at the base of a cell site antenna tower.

In addition the group delay circuit is described as being advantageously implemented in microstrip transmission line. However, those skilled in the art will realize that the group delay adjusting circuit may equivalently be implemented with other transmission line structures such as strip line, slab line and the like.

Figure 1:
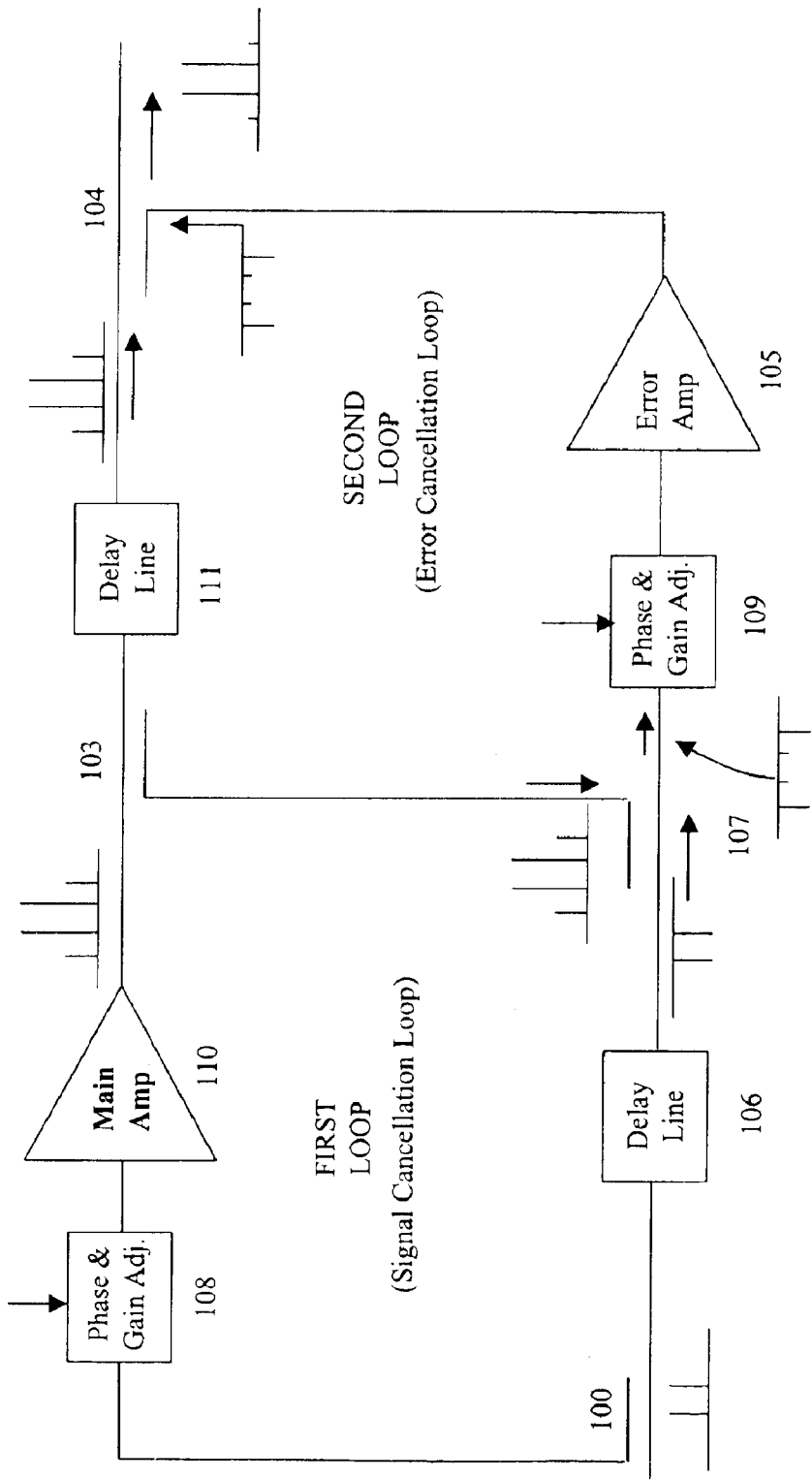
FIG. 1 is a block diagram of a conventional feed-forward amplifier.

FIG. 1 is a block diagram of a conventional feedforward linear amplifier 101. An input signal is applied to coupler 100 which couples portions of the input signal to delay line 106 and to main amplifier 110. Main amplifier 110 produces an amplified output having intermodulation products generated due to non-linearities in main amplifier 110. A portion of the amplified output signal is coupled to summer 107 by coupler 103. Delay line 106 delays the input signal with respect to the output of the amplifier 110 producing a delayed signal such that the two signals reach summer 107 at substantially the same time, but reversed in phase by 180°.

The output of summer 107 is an error signal which is coupled to error amplifier 105. Error amplifier 105 increases the amplitude of the error signal producing an error correction signal. The error correction signal is matched in amplitude to the intermodulation products (i.e. spurious component) generated by main amplifier 110 and delay line 111, but reversed in phase by 180°. The resultant vector cancellation of the intermodulation products is performed in coupler 104 where the error correction signal is subtracted from the amplified input signal. The vector cancellation must be performed with a high degree of accuracy. If the error correction signal is matched in amplitude and phase to the intermodulation products, the error correction signal tends to completely cancel the intermodulation products of the main amplifier. However, even with the high-precision components used in the amplifier, the error signal in reality cannot completely cancel the spurious component generated by main amplifier 110. In general, a cancellation of substantially 40 dB requires that the error correction signal be maintained with greater than 0.5 degrees phase accuracy and 0.1 dB amplitude accuracy which is difficult to achieve in production.

Figure 2:
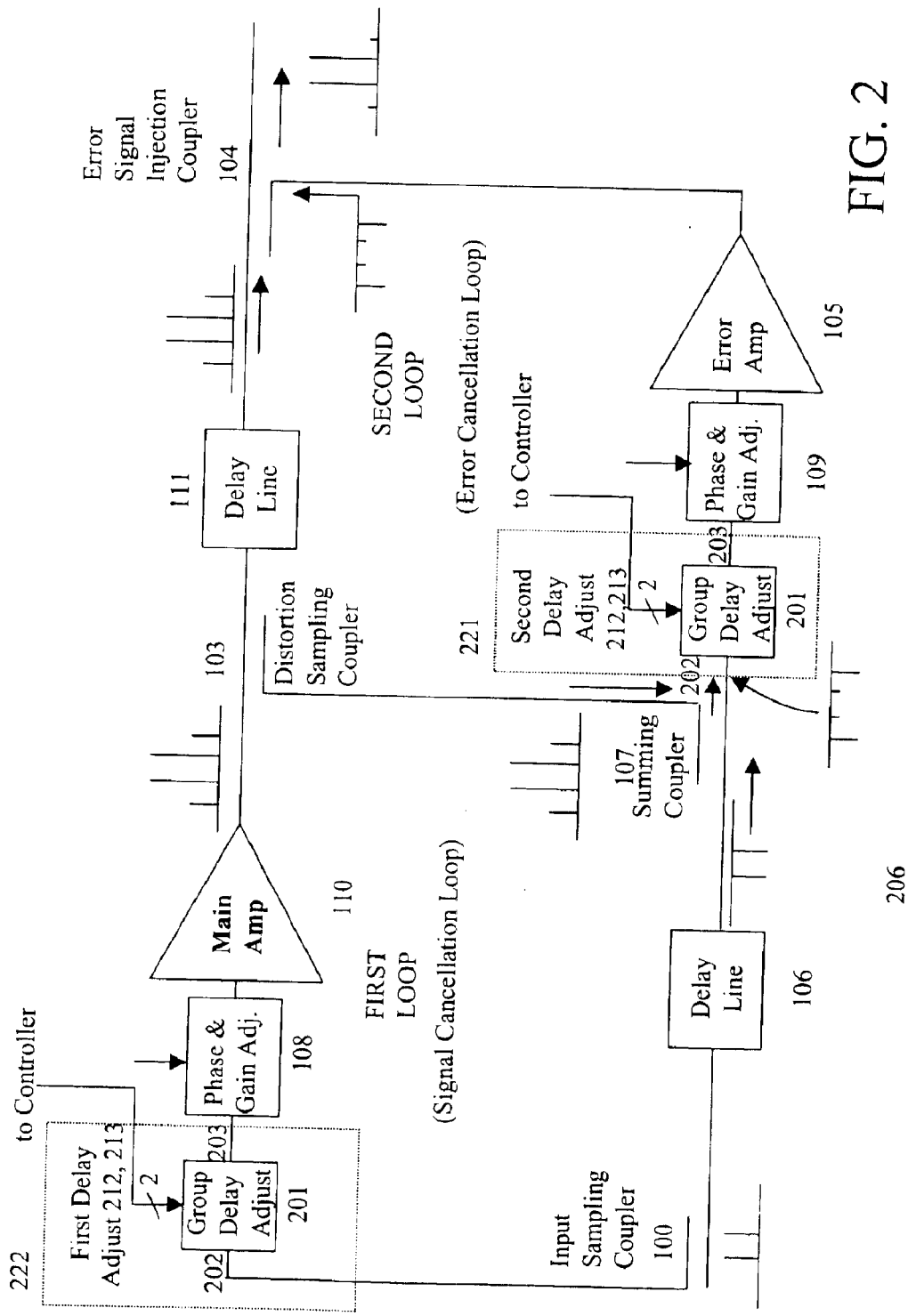
FIG. 2 is a first embodiment of a feed-forward amplifier system having a virtual inductor group delay adjuster circuit.

FIG. 2 is a first embodiment of a feed-forward amplifier system 206 having a virtual inductor group delay adjuster circuit (group delay adjuster circuit) 201. The previously described feed forward amplifier shown has a first group delay adjuster circuits 201 disposed in the first loop at position 222 and a second group delay adjuster circuit 201 disposed in the second loop at position 221. First and second group delay adjusting circuits 201, 221 are similarly constructed, and controlled independently of each other. The first group delay adjusting circuit is disposed in a main amplifier path that includes the first group delay adjuster 201, phase and gain adjuster circuits 108, and main amplifier 110. The second group delay adjusting circuit 201 is disposed in an error amplifier path that includes the second group delay adjuster 221, the second phase and gain adjuster circuits 109, and the error amplifier 105. The first group delay adjuster circuit 201 has an input 202 coupled to the coupled port of the input sampling coupler 100, and an output 203 coupled to an input of the phase and gain adjusting circuit 108. The second group delay adjuster circuit 201 has an input 202 coupled to the output port of the summing coupler 107, and an output 203 coupled to an input of the phase and gain adjusting circuit 109.

In the feed forward amplifier having a group delay adjustment circuit 201 shown, it is desirable to match the characteristics of signal paths in the first and second loops to optimize electrical performance. A method of matching the loops is delay equalization. The first and second group delay circuits tend to allow cancellation in each loop to be improved. A control system (not shown) is typically coupled to various circuit elements such as the phase and gain adjusting circuits 108, 109 via digital or analog control lines. The control lines allow adjustment of the overall amplifier 206, utilizing control methods known to those skilled in the art, to achieve a desired cancellation.

In the embodiment shown the control system controls the first group delay adjustment circuits 201 through a first delay adjustment control. The first delay adjustment control consists of two control signal inputs 212, 213 coupled from the control system to the first group delay adjustment circuit. In the embodiment shown the control system also controls the second group delay adjustment circuit 201 through a second delay adjustment control. The second delay adjustment control consists of two control signal inputs 212, 213 coupled from the control system to the second group delay adjustment circuit. Thus four independent control signals control the two identical group delay adjustment circuits disposed in the amplifier 206. The four control signals operate in cooperation in a manner that tends to optimize cancellation in each loop by adjusting group delay in the corresponding section of the loop. The group delay adjustment circuits advantageously tend to eliminate the lengthy process of delay equalization between the two active and passive sections of each loop.

In the feed forward amplifier system shown 206 the various circuits are typically constructed as modules that are mounted in a rack or chassis in a manner known to those skilled in the art. The modules are coupled together by interconnecting transmission lines or cables, such as coaxial cable. The modules may be constructed in a variety of ways known to those skilled in the art. In particular, microstrip transmission lines are often used advantageously in module construction at radio and microwave frequencies. As will be appreciated by those skilled in the art that microstrip transmission lines may be utilized to connect circuits with a transmission line of known impedance, or may be used to construct various circuit elements such as filters, fixed capacitances, fixed inductances and the like. Microstrip circuits are typically easy to manufacture, tending to reduce overall amplifier construction cost. Thus, it would be desirable to be able to construct a group delay adjusting circuit with microstrip transmission line circuitry.

Figure 3:
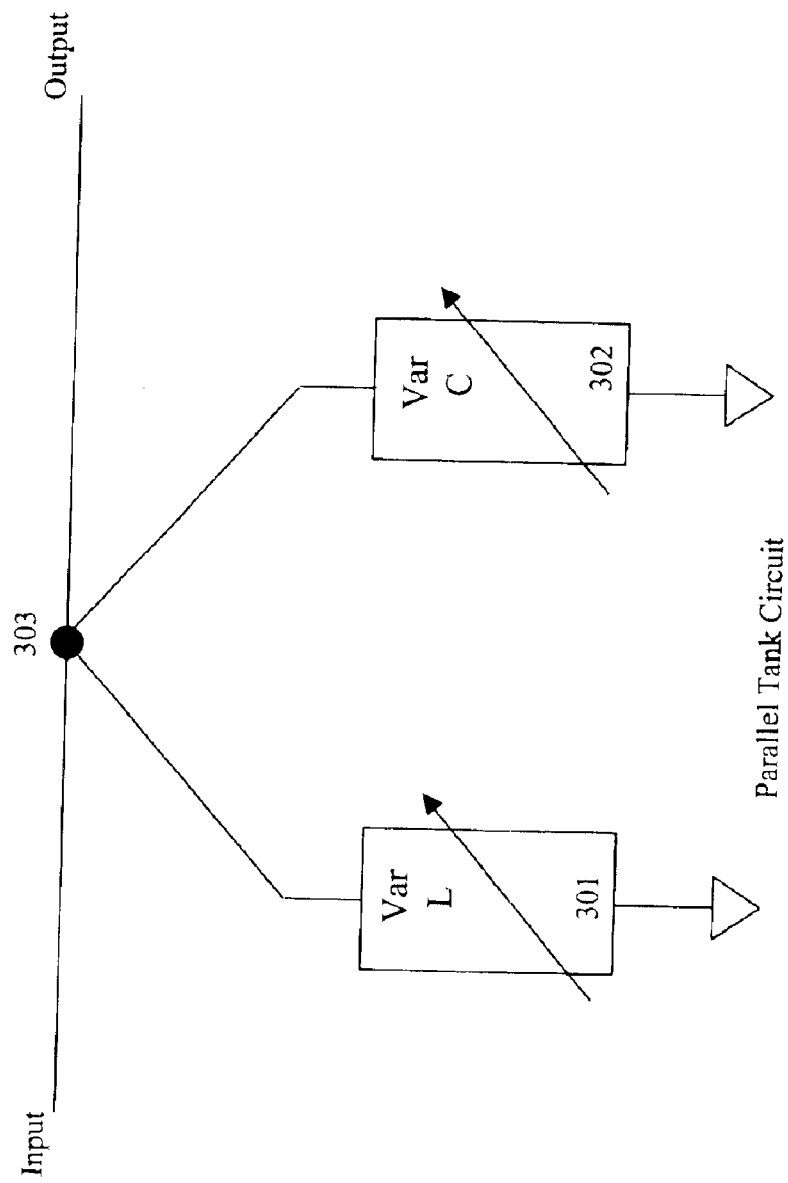
FIG. 3 is a block diagram of a conventional group delay adjustment circuit.

FIG. 3 is a block diagram of a conventional group delay adjustment circuit. The parallel variable inductance 301 and variable capacitance 302 circuit (parallel LC circuit) shown is suitable for adjusting group delay. In the circuit shown a first terminal of the variable inductance 301 and a first terminal of the variable capacitance 302 are coupled to a common node 303. The second terminal of each component 301, 302 is coupled to a ground. A signal input to node 303 undergoes a change in group delay when it appears at the output, due to the effects of the variable inductance 301 and the variable capacitance 302.

The two adjustable components shown provide a continuously variable phase shift depending upon the values of each component. A circuit having a slope variable phase shift over a desired frequency range, such as the parallel LC circuit, may be used to adjust group delay. However, there are disadvantages to this approach. A primary disadvantage relates to the inductance; fixed and variable inductors are typically difficult to build and adjust. In particular variable inductors are poorly suited for electronic control in varying their inductance. It is desirable to have a group delay that provides the group delay adjustment range of a parallel LC circuit, has an inductance that is electronically adjustable, and is easily manufactured.

Figure 4:
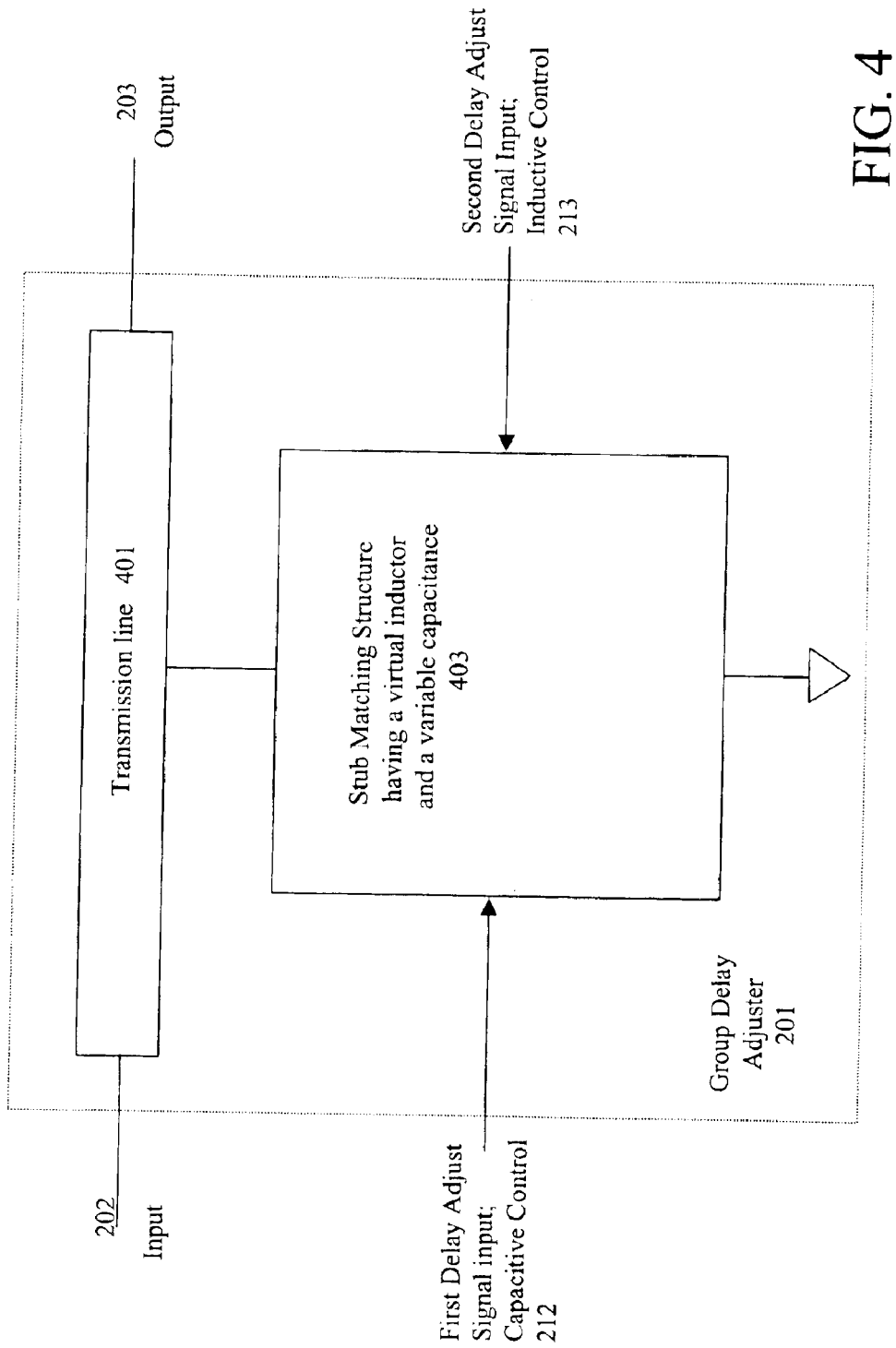
FIG. 4 is a block diagram of an embodiment of a group delay adjustment circuit having a stub matching structure.

FIG. 4 is a block diagram of an embodiment of a group delay adjustment circuit 201 utilizing a microstrip transmission line 401, and having a stub matching structure 403. The group delay adjustment circuit shown advantageously utilizes microstrip circuitry, electronic tuning, and the elimination of inductors to achieve the group delay adjustment range of a parallel LC group delay adjustment circuit without using inductors.

A conventionally constructed transmission line 401 is coupled to an input 202, and an output 203. The transmission line 401 is constructed to have a characteristic impedance matched to the impedances seen at the input 202 and the output 203. The transmission line may be implemented in a variety of forms including microstrip, stripline, slab line and the like. In the embodiment shown the transmission line is a microstrip transmission line having a characteristic impedance of 50 Ohms. Those skilled in the art will realize that values of characteristic impedance other than 50 Ohms may be used. For example a characteristic impedance of 75 Ohms is commonly used in television circuitry.

A stub matching structure (including a virtual inductor) 403 is coupled to the conventionally constructed transmission line 401 through a first terminal of the stub matching structure that includes a virtual inductor. A second terminal of the stub matching structure having a virtual inductor is coupled to ground. Thus, the stub matching structure having a virtual inductor 403 is shunted from the transmission line to ground. The stub matching structure includes two reactances: a virtual inductor 403 that provides a variable inductive reactance, and a variable capacitive reactance. Each reactance is shunt coupled to the transmission line 401.

At the point the variable capacitance and the variable virtual inductance couple to the transmission line, a variable capacitive reactance, and a variable inductive reactance is seen at that point by a signal propagating along the transmission line 401.

A first delay adjust signal input, or capacitive control signal 212 is coupled to the stub matching structure having a virtual inductor 403. The first delay adjust signal input 212 provides electronic control of the variable capacitance contained in the stub matching structure having a virtual inductor 403.

A second delay adjust signal input, or inductive control signal 213 is coupled to the stub matching structure having a virtual inductor 403. The second delay adjust signal input 213 provides electronic control of the virtual inductance contained in the stub matching structure having a virtual inductor 403. Typically the first and second delay adjust signals are variable voltages that change the impedances in proportion to the voltage applied to on each signal line. However those skilled in the art will appreciate that in alternative embodiments a variable current could be applied to a current to voltage converter circuit (not shown) to cause the impedances to vary. In a further alternative embodiment the control signals may be digital signals applied to a digital to analog converter (DAC) (not shown) to provide a suitable control signal, such as a voltage, at the group delay adjuster circuit 201.

Figure 5:
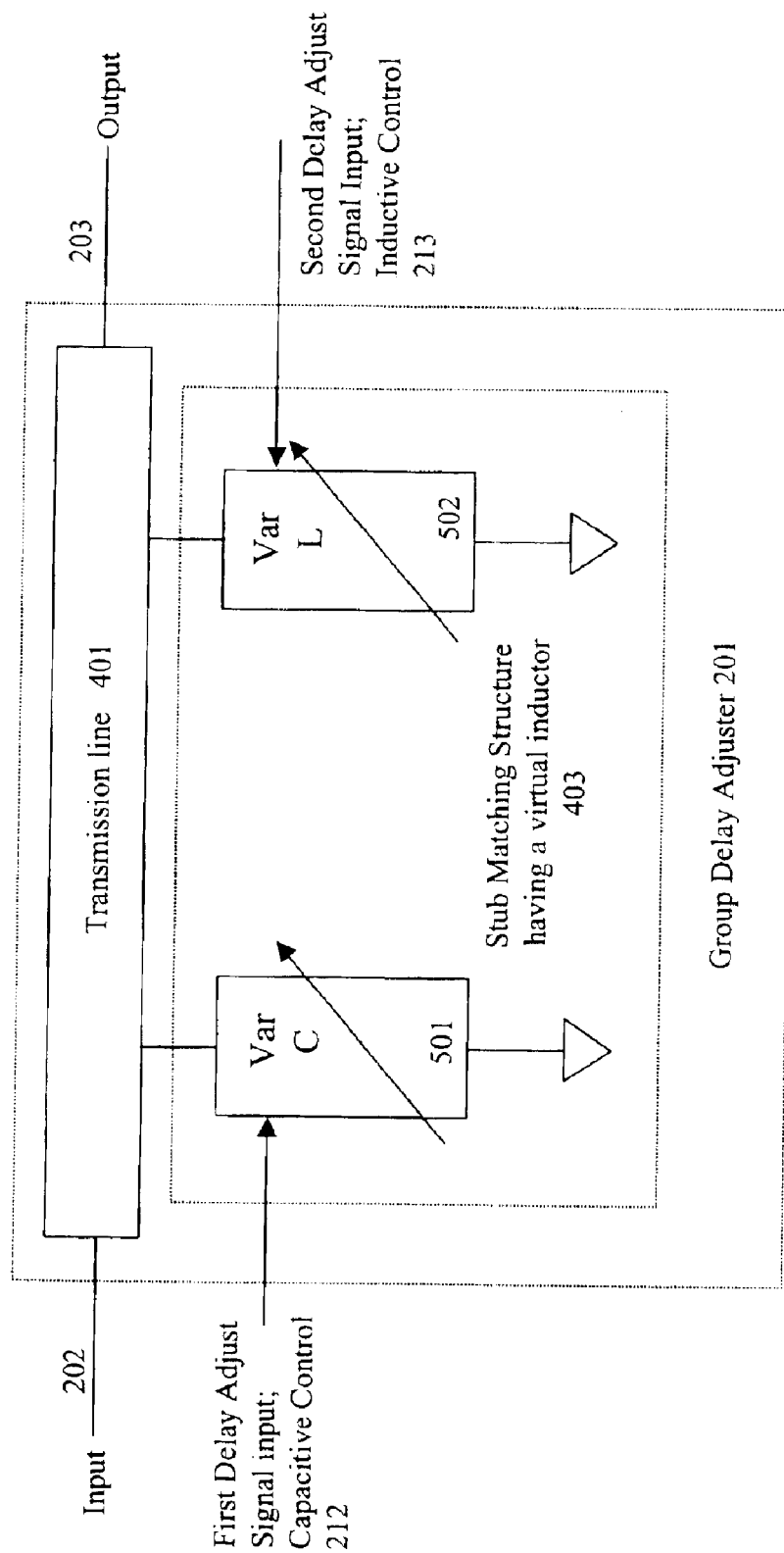
FIG. 5 is a block diagram of an embodiment of the stub matching circuit having a virtual inductor.

FIG. 5 is a block diagram of an embodiment of the stub matching circuit having a virtual inductor. This figure shows the internal structure of the stub matching structure having a virtual inductor 403, and how it functions in relation to the group delay adjuster circuit 201. The virtual inductance is contained in the variable inductance block 502. The first delay adjust signal input, or capacitive control 212 is coupled to the variable capacitance 501. The second delay adjust signal input, or inductive control 213 is coupled to the variable virtual inductance 502. The variable capacitance 501 is shunt coupled from the transmission line 401 to ground. The variable virtual inductance 502 is shunt coupled from the transmission line 401 to ground.

Figure 6:
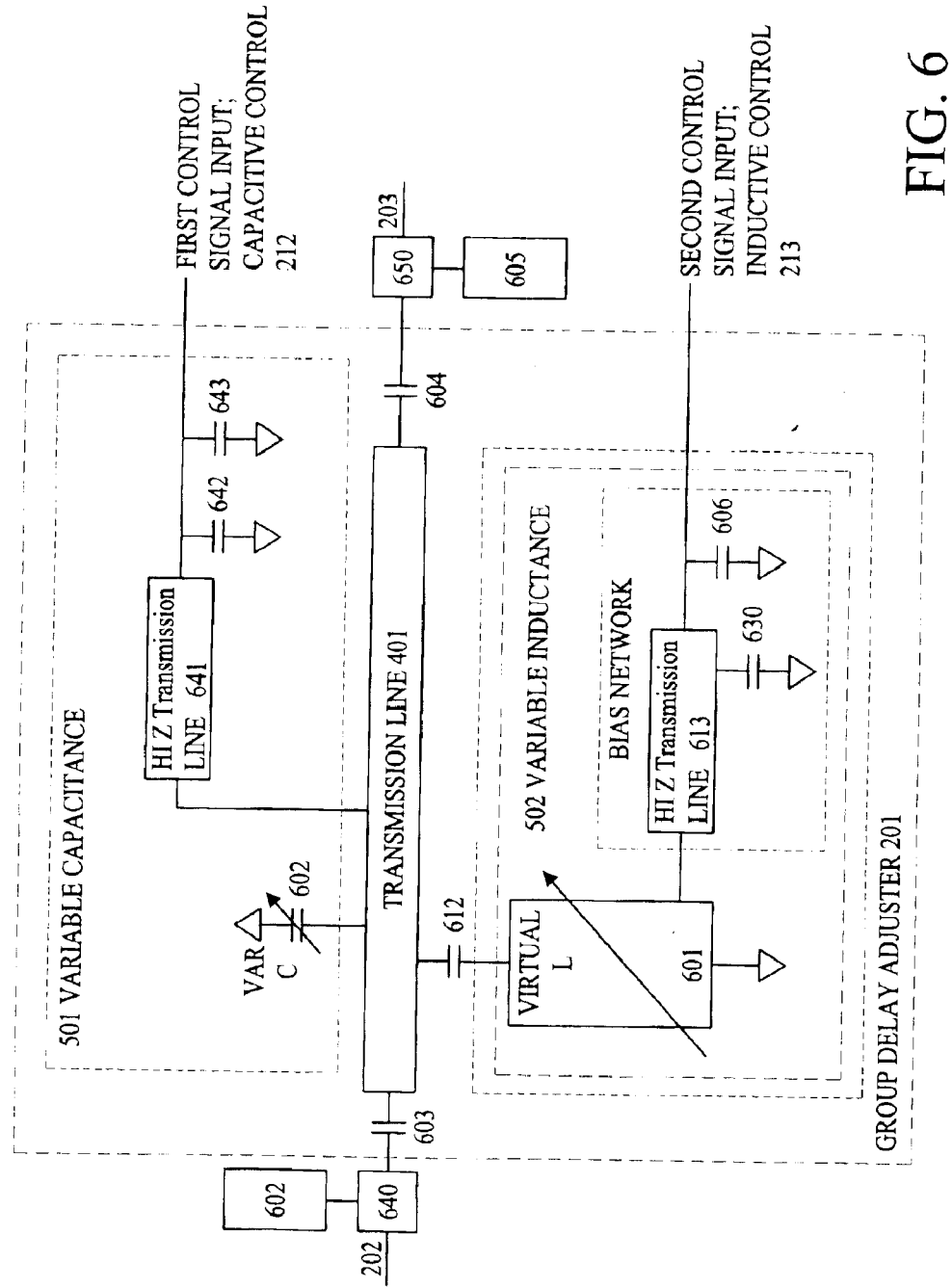
FIG. 6 is a block diagram of the group delay adjustment circuit showing the construction of the variable virtual inductance and variable capacitance.

FIG. 6 is a block diagram of the group delay adjustment circuit showing the construction of the variable virtual inductance 502, variable capacitance 501, and supporting circuits. A transmission line 401 includes a pair of conventionally constructed matching circuits 602, 605 coupled to a transmission line input 640 and to a transmission line output 650, respectively. In the embodiments shown the matching circuits 602, 605 are constructed from microstrip transmission line. A pair of conventionally constructed DC blocking capacitors 603, 604 are disposed between input transmission line 640 and a first input of transmission line 401, and between an output of a second terminal of the transmission line 401 and an output of transmission line 650 respectively.

The variable capacitance circuit 501 includes a variable capacitance 602 having a first terminal coupled to the transmission line 401 and a second terminal coupled to ground. In the embodiment shown the variable capacitance 602 is a varactor diode. Those skilled in the art will appreciate that a varactor diode, is a diode that has a substantial capacitance associated with it and is utilized to provide a voltage adjustable capacitance.

The varactor diode 602, in the variable capacitance circuit 501, is capable of providing a varying capacitance depending upon a capacitive control voltage 212 established across the diode. Equivalently, a varactor configuration where current flow through the varactor diode is present could be used. In the embodiment shown the voltage 212 is allowed to be applied to diode 602. Placing conventionally constructed DC blocking capacitors 603, 604, 612 to interrupt the flow of current to other portions of the circuit. The selection of capacitance values is dependent upon the frequencies present. The selection of capacitance values is done by methods known to those skilled in the art.

A high impedance transmission line 641 is typically utilized in conjunction with one or more signal bypass capacitors 642 and 643 to prevent leakage of signals present on the transmission line 401 onto the capacitive control line 212. The high impedance transmission line 641 is designed by methods known to those skilled in the art to block, or isolate, a desired band of signals from passing through it. To remove any residual signals that have made it past the transmission line 401, one or more shunted bypass capacitors 642, 643 having values selected by methods known to those skilled in the art, are disposed at the end of the high impedance transmission line 641 to shunt the remaining signal to ground. Those skilled in the art will realize that the bypass capacitor 642 is chosen to have a low impedance at the desired band of signals, and a high impedance at the slowly varying voltage level of the capacitive control signal 212.

The high impedance transmission line of the variable capacitance circuit 641 includes a first port coupled to the transmission line 401. A second port of the high impedance transmission line 641 is coupled to the capacitive control signal line 212. Those skilled in the art will appreciate that an equivalent circuit that provides a high series impedance at high frequencies may be substituted for the high impedance transmission line 641. In the embodiment shown the high impedance transmission line is constructed in microstrip. However those skilled in the art will realize that other transmission line types may be equivalently substituted for microstrip transmission line.

The bias line devised from a high impedance transmission line 613 is conventionally constructed and functions in a manner similar to a radio-frequency choke (a device known to those skilled in the art.) A choke is a frequency selective device allowing direct current (DC), or slowly varying electrical control signals to pass through while simultaneously rejecting rapidly varying radio frequency (RF) signals. Alternately, a series choke, inductor, or the like that allows DC or varying control signals to pass may be equivalently substituted for the choke 613, 641. In this manner RF, signals do not interfere with the circuitry generating the control signal.

Capacitors 630, 606 are coupled at various points on the transmission line. Bypassing can be provided by one or more capacitors. The purpose of bypass capacitors is to provide RF bypassing of radio frequency signals to ground. Bypassing can be performed, as known to those skilled in the art, by one or more capacitors to selectively eliminate undesired RF signals. Node 213 is the input of a DC control signal.

This DC signal is varied, as necessary, to control the desired characteristic value of virtual inductor 601.

The virtual inductor 601, of the variable inductance circuit 502, includes a second terminal coupled to ground and a first terminal coupled to a first terminal of a DC blocking capacitor 612. The DC blocking capacitor 612 includes a second terminal coupled to the transmission line 401. DC blocking capacitor is conventionally constructed, with a value of capacitance chosen appropriate to the frequency of operation, as will be appreciated by those skilled in the art. Virtual inductor 601 includes a third terminal coupled to a first terminal of a high impedance transmission line 613. The third terminal of virtual inductor 601 is a control signal input.

A virtual inductor 601 of the variable inductance circuit includes in its construction a variable capacitance (not shown) constructed similarly to capacitance 602. The variable capacitance includes a second terminal shunt coupled to ground and a first terminal coupled in series with a first terminal of a quarter wavelength transmission line (not shown). A second terminal of the quarter wavelength transmission line forms the first terminal of the virtual inductor 601. In the exemplary embodiment shown virtual inductor 601 utilizes a varactor diode (previously described) that produces an electronically variable capacitance. In an alternative embodiment multiple varactor diodes are utilized to produce an overall desired capacitance.

A high impedance transmission line 613 of the variable inductance circuit is constructed similarly to that of high impedance transmission line 641. A first terminal of the high impedance transmission line 613 is coupled to the third terminal (control signal input) of the virtual inductor 601.

Bypass capacitors 630, 606 of the virtual inductance circuit 502 shunt any remaining signal energy present at the second terminal of the high impedance transmission line 613 to ground to prevent it from traveling any further down the inductive control signal line coupled to the inductive control signal terminal 213. Bypass capacitors 630, 606 are conventionally constructed, with values of capacitance chosen appropriate to the frequency of operation, as will be appreciated by those skilled in the art. Bypass capacitor 630 includes a second terminal shunted to ground and a first terminal coupled along the length of the high impedance transmission line 613, typically in the vicinity of the second terminal of transmission line 613. Bypass capacitor 606 includes a second terminal shunted to ground and a first terminal coupled along the length of the high impedance transmission line 613, typically in the vicinity of the second terminal of transmission line 613. As used throughout this application shunting a component to ground or grounding a component are synonymous terms that include direct coupling to ground as well as indirect coupling to ground via an open circuited quarter wavelength stub, a shortened fan shaped open stub, or other equivalent methods known to those skilled in the art.

Figure 7:
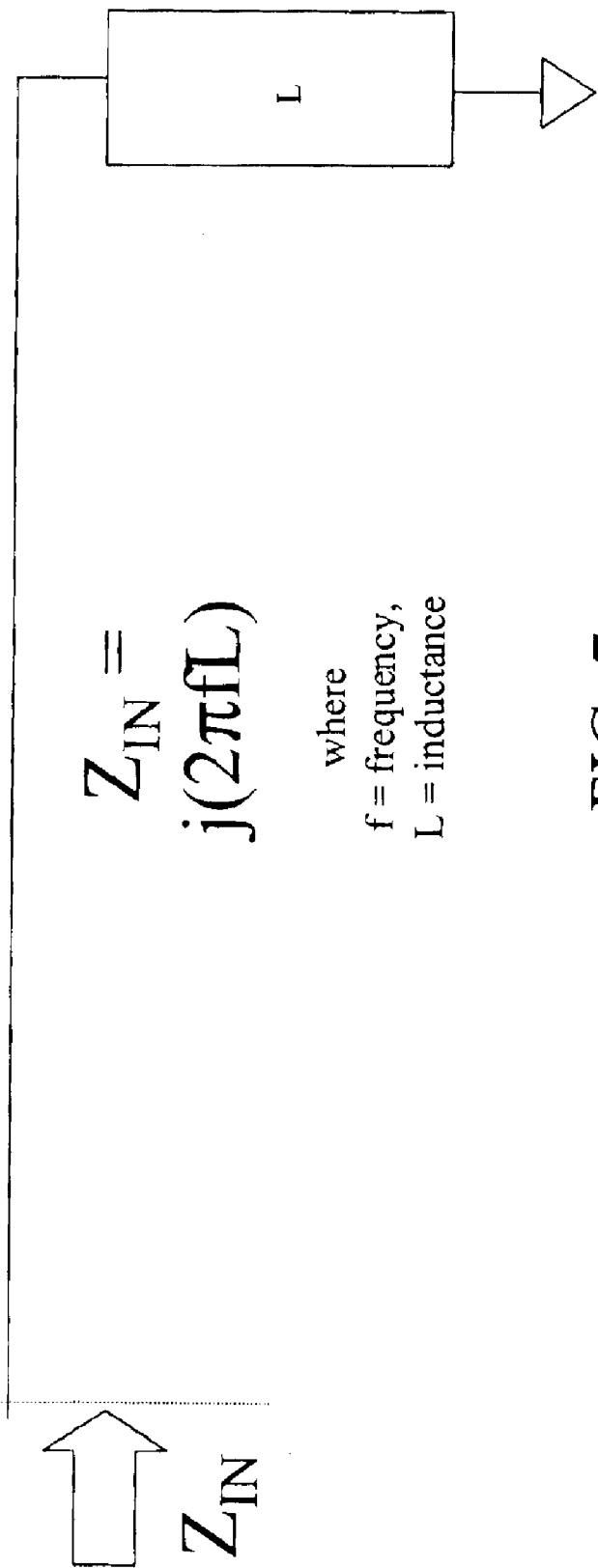
FIG. 7 is an illustration showing the terminal impedance of a shunt inductor having negligible lead length at high frequency.

FIG. 7 is an illustration showing the terminal impedance of a shunt inductor having negligible lead length at high frequency. The value $Z_{IN}$ represents the terminal impedance of the inductor, L, at the frequency of operation at a first terminal. A second terminal of L is coupled to ground. Input impedance, $Z_{IN}$, is a function of inductance, L, and frequency, f, according to the relationship $Z_{IN}=jX=j(2\pi fL)$. Impedance is a vector quantity, with real and imaginary components. The full form for expressing input impedance, in general, is $Z_{IN}=R+/-jX$, where X is capacitive or inductive reactance, and R is a resistive part. (In FIG. 7, R=0.) An inductive reactance is $+jX$, and a capacitive reactance is $-jX$.

For any given frequency, input impedance changes proportionally to inductance. Input impedance can be adjusted by varying the inductance. Inductors can be constructed in many ways. However, these conventional ways of constructing inductors are typically difficult to integrate onto a semiconductor substrate or printed wiring assembly. Examples of typical inductors include, wire wound elements with or without cores, and metallic traces, disposed in spiral patterns, on printed circuit boards. Producing an inductor that is capable of having its inductance varied adds another level of complexity to these designs further reducing their usefulness. It is desirable to provide an inductive terminal impedance that is easy to fabricate without using a conventional inductor.

Figure 8:
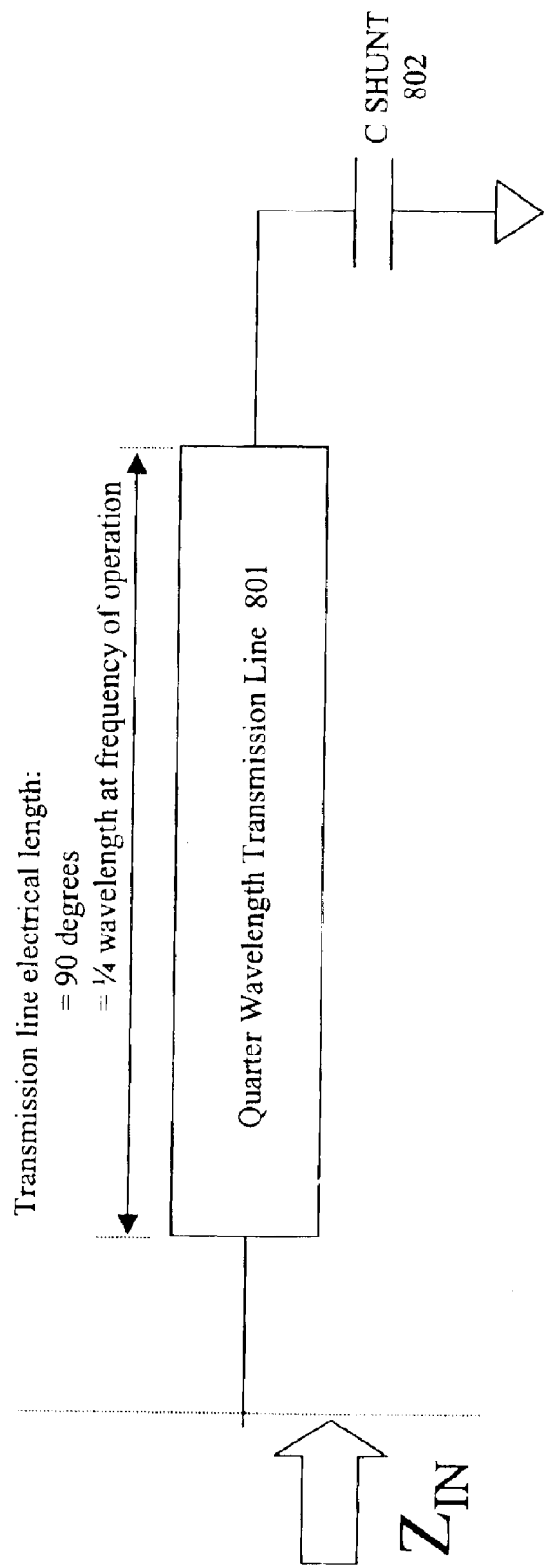
FIG. 8 is an illustration showing the terminal impedance of a network having a quarter wavelength transmission line the high frequency coupled to a shunt capacitor.

FIG. 8 is an illustration showing the terminal impedance of a network having a quarter wavelength transmission line, 801, coupled to a shunt capacitor 802. By introducing a phase shift of ninety degrees, as provided by the transmission line 801, the sign of a capacitive impedance of capacitor 802 ($C_{SHUNT}$) can be changed from a negative (capacitive), to a positive inductive impedance. Thus, a capacitor plus a phase shift may be made to appear as an inductor, at an input terminal of the phase shifting transmission line.

A first input terminal of the quarter wavelength transmission line 801 is labeled $Z_{IN}$. The opposite end of transmission line 801 forms a second transmission line terminal that is coupled to a first terminal of a capacitor, 802. A second terminal of the capacitor 802 is coupled to a ground potential or terminal. Input impedance, $Z_{IN}$, is a function of the electrical properties of the transmission line and the coupled capacitor.

The transmission line 801 is designed to have a length of a quarter wavelength at a desired frequency of operation. Equivalent transmission lines can be constructed in a variety of different ways, as well known to those skilled in the art. Examples include, but are not limited to, etched metal on a printed circuit board (microstrip, stripline, etc.) and self contained structures (like coaxial cable, open wire line, etc.)

The capacitor 802 disposed at the end of the transmission line may be fixed or variable. Capacitor 802 can also be constructed in a variety of ways. Examples include, but are not limited to, lumped element devices, parallel plate capacitors, variable capacitance diodes (varactor or PIN types), and interdigitated structures realized as metallic traces on printed circuit boards. In the case of variable elements, a physical or electrical parameter is varied to affect the change in value.

As shown in the figure, a quarter wavelength transmission line having a purely capacitive termination, results in inductive impedance at its input terminal.

Transforming the sign of an impedance is typically performed by inserting a quarter wavelength of a transmission line in front of an impedance being transformed. As is known by those skilled in the art, the transformation is performed as described in the following paragraphs. For a conventional transmission line having very little loss and a characteristic impedance of $Z_0$, with a shunt load ($Z_t$) at the end of the transmission line, those skilled in the art will recall that the impedance looking into the other end of the transmission line ($Z_{inp}$) is found from evaluating a set of transmission line equations to be:

$$\frac{Z_{inp}}{Z_o} = \frac{\frac{Z_t}{Z_o} + \tanh(j\beta)l}{1 + \frac{Z_t}{Z_o}\tanh(j\beta)l} \text{ Where} \quad (1)$$

$$\beta = \frac{2\pi}{\lambda}. \quad (2)$$

Utilizing a trigonometric identity removes the complex number from the argument of the trigonometric function, and transforms the hyperbolic function to a conventional tangent function:

tanh jx=j tan x. The expression becomes:

$$\frac{Z_{inp}}{Z_o} = \frac{\frac{Z_t}{Z_o} + j\tan\beta l}{1 + \frac{Z_t}{Z_o} j\tan\beta l} \quad (3)$$

For the quarter wavelength transmission line, $$l = \frac{\lambda}{4}, \text{ and} \quad (4)$$

$$\beta l = \left(\frac{2\pi}{\lambda}\right)\left(\frac{\lambda}{4}\right) = \frac{\pi}{2}$$

Inserting these values results in:

$$Z_{imp} = Z_o \left[\frac{\frac{Z_t}{Z_o} + j\tan\frac{\pi}{2}}{1 + \frac{Z_t}{Z_o}j\tan\frac{\pi}{2}}\right] \quad (5)$$

where:

$$\tan\frac{\pi}{2} = \infty$$

yields a solution of infinity divided by infinity for $Z_{imp}$, an indeterminate form that requires the application of L'Hôpital's Rule to attempt to find a solution.

However, with the application of L'Hôpital's Rule a second indeterminate form is obtained as well. With a second application of L'Hôpital's rule a solution is found:

$$Z_{inp} = Z_o \frac{1}{Z_t/Z_o} \quad (6)$$

$$Z_{inp} = \frac{Z_o^2}{Z_t} \quad (7)$$

Those skilled in the art will realize that by having an impedance in the denominator that is a complex number, that the sign of the impedance is changed. Inductors are represented by a positive impedance, and capacitors are represented as negative impedances. Thus, a capacitor can be made to look like an inductor, and an inductor can be made to look like a capacitor by inserting a quarter wavelength transmission line in front of it. If a capacitor is chosen as a terminating impedance, $Z_t$, the impedance becomes:

$$Z_t = -j\omega C_{SHUNT} = -j2\pi f C_{SHUNT} \quad (8)$$

Substituting the reactance of the capacitor into the expression for the input impedance of the quarter wave transmission line having the capacitive load yields:

$$Z_{inp} = \frac{Z_o^2}{-j\omega C} = j\frac{Z_o^2}{\omega C} = j\frac{Z_o^2}{2\pi f C} \qquad (9)$$

As can be seen, by applying the rules relating to complex numbers ($j=\sqrt{-1}$) where $1/j=-j$, the sign of the impedance is transformed by the addition of the quarter wavelength line in front of the load $Z_r$. The shunt capacitor 802 reduces the total capacitive reactance making the resultant input impedance inductive.

In summary, for the network shown, the combination of a quarter wavelength transmission line 801 and a shunt capacitor 802 tends to result in an inductive impedance value for $Z_{IN}$. As viewed at the input terminal $Z_{IN}$, the network behaves as an inductor.

Figure 9:
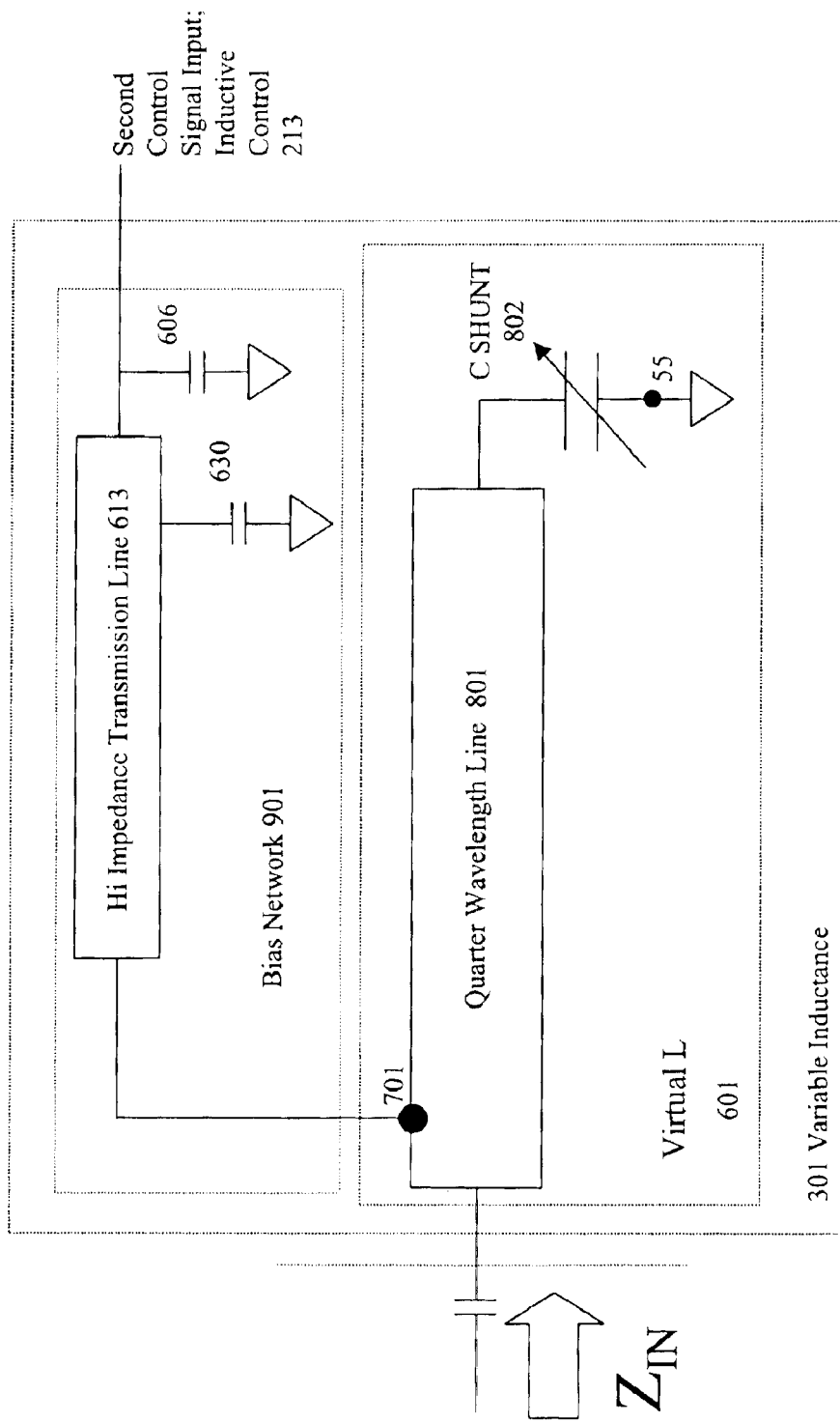
FIG. 9 is a block diagram showing the terminal impedance of a variable inductance virtual inductor.

FIG. 9 is a block diagram showing a variable inductance 301 having a virtual inductor 601. The impedance $Z_{IN}$ at the input terminal of the variable inductance 301 is that of the virtual inductor 601 coupled to the input terminal of the variable inductance 601.

A bias network 901 is coupled to the virtual inductor 601 adjacent to the point 701 where the virtual inductor is coupled to the input terminal of the variable inductance 301. The point of attachment 701 is chosen to have a high impedance (as seen by the bias network). The point of attachment, and the bias network are found utilizing methods known to those skilled in the art, such that signal leakage through the bias network tends to be minimized.

The previously introduced bias network includes a conventionally constructed length transmission line ("bias line"), 613, having high characteristic impedance $Z_{HI}$. Impedance $Z_{HI}$ is typically chosen, as will be appreciated by those skilled in the art, to be several orders of magnitude greater then that of the transmission line 801, being coupled to at a coupling point 701. Equivalently, a series impedance may be substituted for the transmission line. A first terminal of the bias network 901 is coupled to the virtual inductor, 601, at point 701.

A second terminal of the bias line 613 is coupled to a first terminal of a first shunt bypass capacitor 630, and a first terminal of a second shunt bypass capacitor 606 at second control signal input 213. A second terminal of bypass capacitor 606 is coupled to ground. Node 213 is the second control signal input, coupled to an externally supplied inductive control. It is used to change the inductance seen at $Z_{IN}$. A second shunt bypass capacitor, 630, includes a first terminal coupled to a point on the bias line 613, and having a second terminal coupled to ground. Equivalently other bias networks that allow DC to flow into a high frequency circuit, while preventing the loss of high frequency energy may be substituted for bias network 901.

Virtual inductor 601 includes a quarter wavelength transmission line, 801, and a shunt capacitor, 802. One terminal of the quarter wavelength transmission line 601 is connected to the variable inductance input $Z_{IN}$, the other end to a first terminal of variable shunt capacitor ($C_{SHUNT}$), 802. The bias network 901 is coupled to the transmission line 801 at a high impedance point along its length. A second terminal of the variable capacitor 802 is connected to ground at node 55.

The virtual inductor, 601 includes a conventionally constructed quarter wavelength transmission line 801 having a first input terminal coupled to the input terminal $Z_{IN}$. The quarter wavelength transmission line 801 is substantially a quarter wavelength long at a frequency f, of operation. The frequency of operation is typically chosen at mid-band of a desired signal bandwidth of operation. In the embodiment shown the quarter wavelength transmission line is constructed from microstrip. However, other types of transmission line as known to those skilled in the art may be utilized instead of microstrip transmission line. Examples include, but are not limited to, etched metal on printed circuit board (microstrip, stripline, etc.) and self-contained structures (like coaxial cable, open wire line, etc.) In the embodiment shown the transmission line is built from microstrip.

Capacitor 802 is a variable shunt capacitance, previously introduced. The capacitor can also be constructed in a variety of ways. Examples include, but are not limited to, tunable parallel plate or coaxial capacitors, variable capacitance diodes, and any other possible realizations of tunable capacitors. Varying the shunt capacitance varies the resulting inductive impedance. Since precision, electrically tunable capacitors can be more easily fabricated than mechanically variable inductors, this method has great advantage over using tunable inductors. In the embodiment shown one or more voltage variable capacitance (or "varactor") diodes are utilized to produce a variable capacitance.

The variable inductance, 301, works as follows. A control signal is applied at node 213. This may be a DC signal which passes through the high impedance transmission line, 613, and coupled at node 701 to transmission line 801 in the virtual inductor network, 601. Any radio frequency energy incident on this control line is grounded via capacitors 630 and 606. The DC control signal passes through the quarter wavelength transmission line, 801, to the variable capacitor 802. The DC control signal changes the capacitance, which in turn changes the inductance of Virtual L network, 601. The principal here is to vary the shunt capacitance on the end of the transmission line to effectively change the resulting inductive reactance. In this way, the circuit behaves like a virtual inductor.

Figure 10:
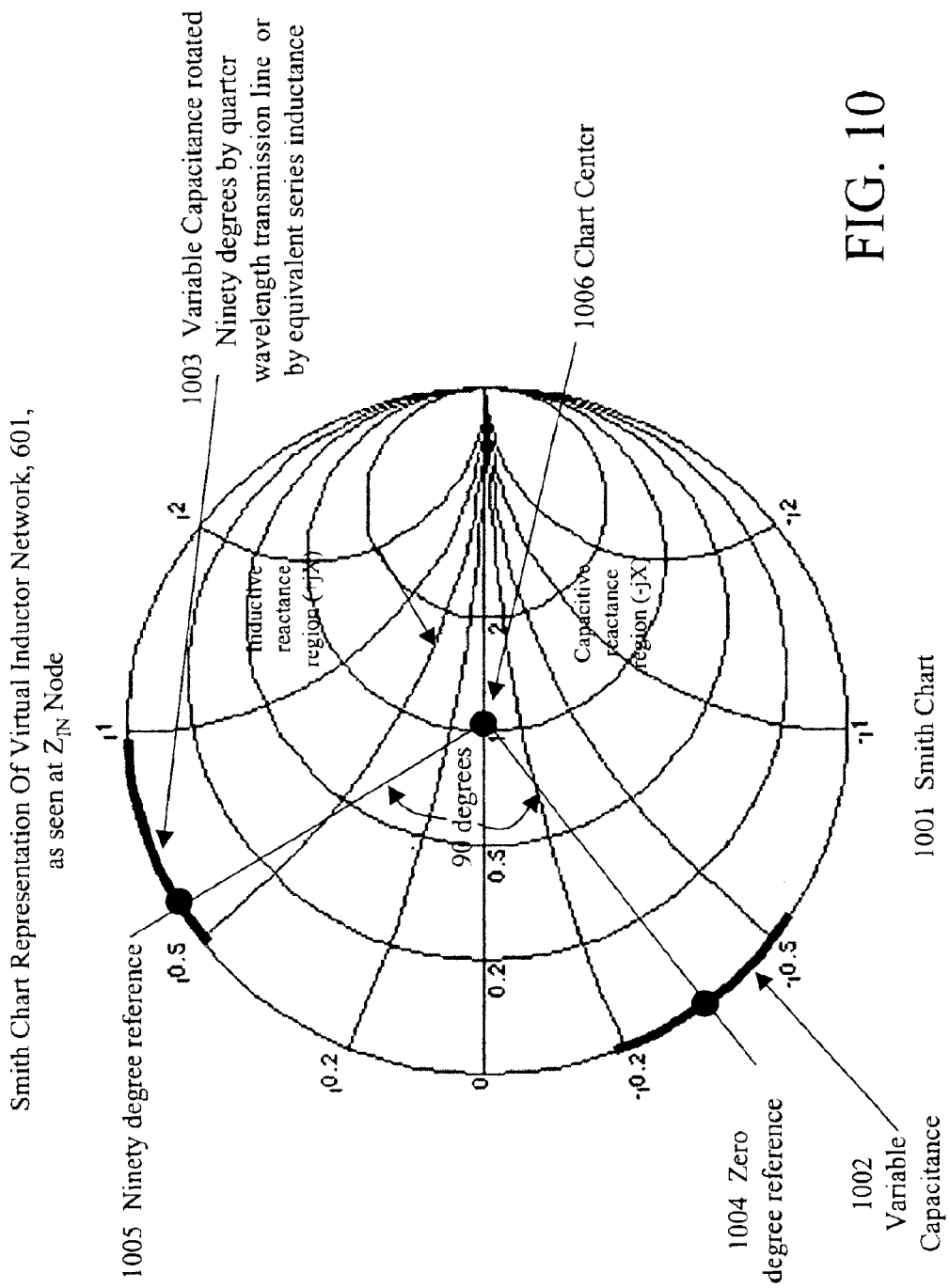
FIG. 10 is a Smith chart representation of an impedance seen at the input of a virtual inductor.

FIG. 10 is a Smith chart (1001) representation of the impedance seen at the input of the virtual inductor circuit, 601. The Smith chart is often used to map impedance values of radio-electronics circuitry. The upper half of the chart is used to map inductive impedance, the lower half of the chart capacitive impedance. A pure capacitance or inductance is plotted on the outer rim of the Smith chart. A fixed capacitance value is represented by a single point at a given frequency on the rim of the lower half of the chart. A variable capacitance is represented by a continuous arc on the perimeter of the outermost circle of the chart 1002.

Line 1002 is the impedance curve of the impedance of the variable shunt capacitor (802 of FIG. 9). Line 1002 represents providing a variable capacitance. Transmission line impedances are represented by rotations of impedance points in circular arcs about the center 1006 of the chart 1001. The quarter wavelength transmission line is represented by the rotation of the capacitance curve by 90 degrees about the center of the chart. Adding a transmission line provides a rotation of variable capacitance by transferring the capacitance values to a new set of impedance points. The rotation is about the center of the chart and the amount of displacement about the rim of the chart is proportional to the length of the transmission line. Reference line 1004 represents the zero degree reference point of a single point on the capacitive reactance curve. Line 1005 represents the same point rotated 90-degrees by a quarter wavelength transmission line. As can be seen from the chart the arc representing the impedance of the variable capacitor now appears to be an inductance as it falls in the upper half of the Smith Chart.

Figure 11:
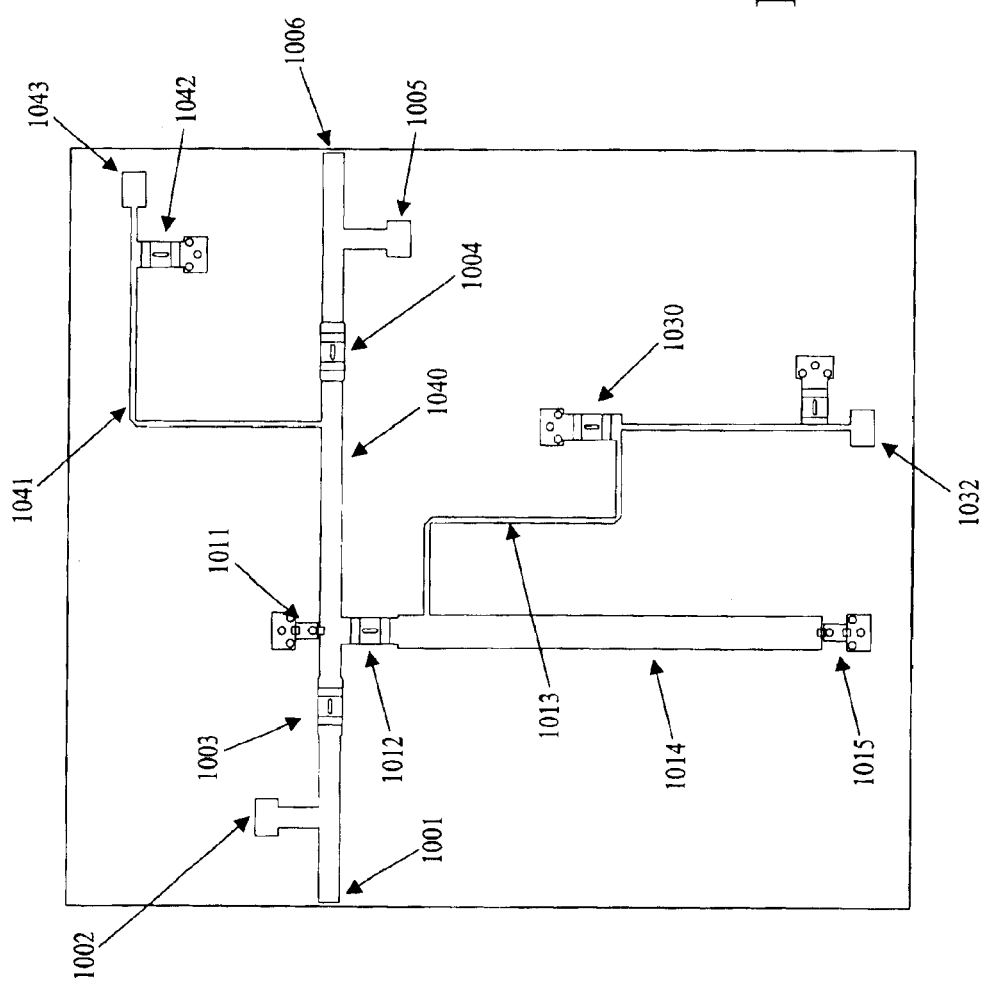
FIG. 11 is a circuit layout of a first embodiment of a group delay adjusting circuit.

FIG. 11 is a circuit layout of a first embodiment of a group delay adjusting circuit. A microstrip through line 1040 includes the first terminal and the second terminal. The first terminal with microstrip through line 1040 is coupled to a first terminal of a DC blocking capacitor 1003. The second terminal of microstrip through line 1040 is coupled to a first terminal of a second DC blocking capacitor 1004. The first DC blocking capacitor 1003 includes a second terminal coupled to a first terminal of a microstrip line input port 1001. Microstrip line input port includes a second terminal forming an input connection, and a third terminal coupled to a stub matching structure 1002. The stub matching structure forms a T-junction with the microstrip line input port 1001.

A second terminal of DC blocking capacitor 1004 is coupled to a first terminal of a microstrip line output port 1006. Microstrip line output port 1006 includes a second terminal forming an output and a third terminal coupled to a stub matching structure 1005. Stub matching structure 1005 is coupled to the microstrip output port as a T-junction.

Microstrip main through line 1040 includes a third terminal along its length, that is coupled to a first terminal of a high impedance microstrip transmission line 1041. A second terminal of high impedance microstrip transmission line 1041 is coupled to a first terminal of an RF bypass capacitor 1042. A second terminal of RF bypass capacitor 1042 is coupled to ground. The first terminal of RF bypass capacitor 1042 is coupled to a second control signal input port, or pad, 1043. A signal is input at pad 1043 to control of the virtual inductor.

A fourth terminal is formed along the length of microstrip main through line 1040. The fourth terminal of microstrip main through transmission line 1040 is coupled to a first terminal of a DC blocking capacitor 1012. A second terminal of DC blocking capacitor 1012 is coupled to a first port of a quarter wave length transmission line 1014. A second terminal quarter wave length transmission line 1014 is coupled to a first terminal of a varactor diode 1015. A second terminal of varactor diode 1015 is coupled to ground. A third terminal along the length of the quarter wave length transmission line 1014 is coupled to a first terminal of a high impedance transmission line 1013. A second terminal of high impedance transmission line 1013 is coupled to a first terminal of RF bypass capacitor 1030. A second terminal of RF bypass capacitor 1030 is coupled to ground. The second terminal of high impedance transmission line 1013 is also coupled via a circuit trace to a control signal input port 1032. Control signal input port 1032 supplies a control signal to the virtual inductor that comprises quarter wave length transmission line 1014 and varactor diode 1015. First control signal input port 1032 may also be supplied with an additional shunt coupled bypass capacitor.

Microstrip main through transmission line 1040 includes a fifth terminal along its length that is coupled to a first terminal of a varactor diode 1011. A second terminal of varactor diode 1011 is coupled to ground. A single section group delay adjustor such as described above typically allows for 0.5 ns of adjustment in the 2.1 GHz band. The circuit above may be cascaded with identical or similar group delay adjustment circuits in order to gain additional bandwidth and group delay adjustment range. Microstrip circuits such as described above typically utilize copper traces or equivalent disposed upon a first side of dielectric substrate such as Teflon-glass or equivalent with a substantially solid ground plane on a second side of the dielectric substrate. In alternative embodiment, the microstrip circuits are part of a multiplayer laminated printed wiring board (PWB) assembly.

Figure 12:
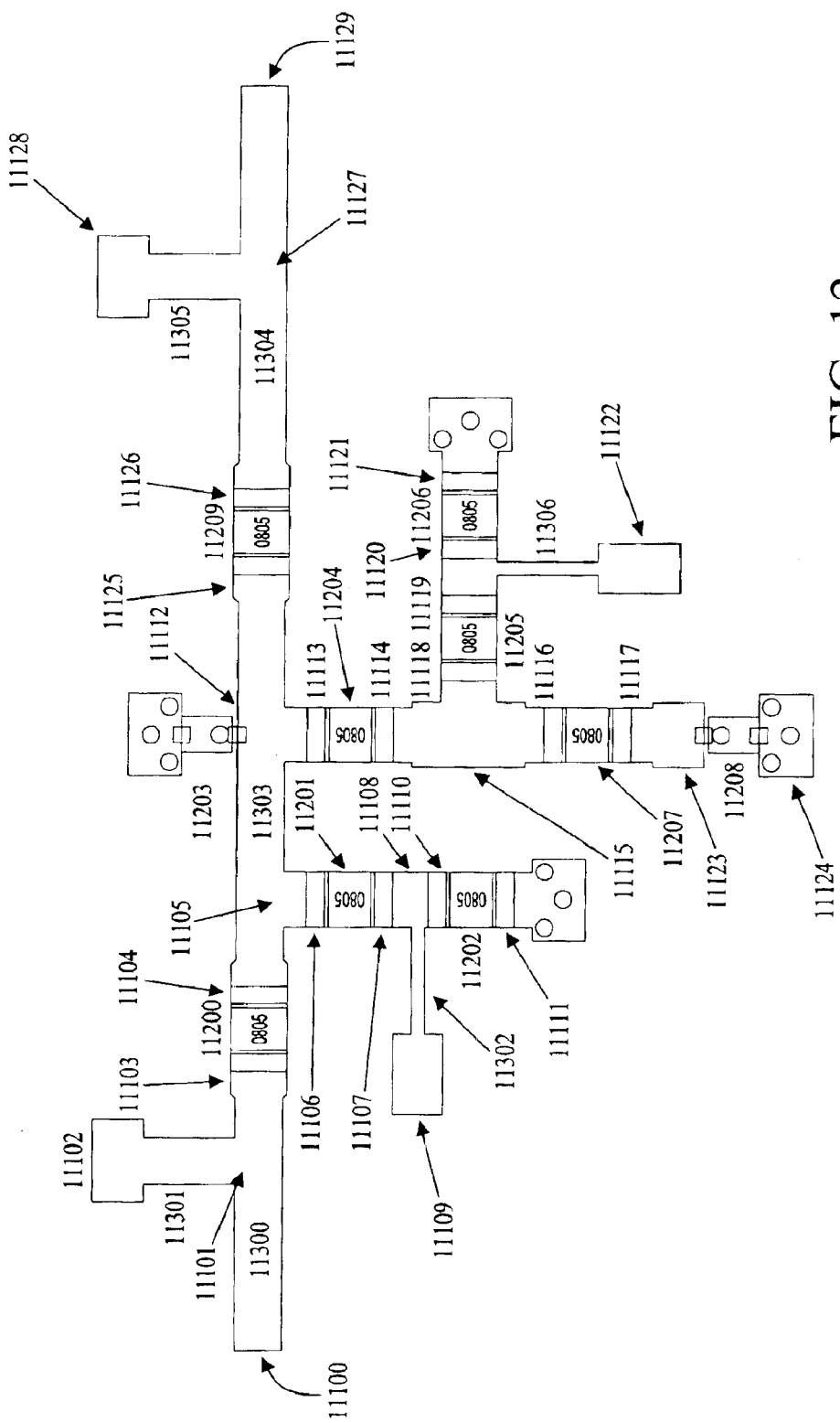
FIG. 12 is a circuit layout of a second embodiment of a group delay adjusting circuit.

FIG. 12 is a circuit layout of a second embodiment of a group delay adjusting circuit. In the embodiment shown, discreet components including resistors, high frequency inductors, capacitors, microstrip lines, and varactor diodes are utilized. In the embodiment shown, an input port 11100 and an output port 11129 are matched to the circuitry they are coupled to such that the delay circuit functions in a 50 Ohm characteristic impedance system. However, the characteristic impedances and the matching structure may be adjusted by methods known to those skilled in the art such that the group delay circuit is matched to a system of circuitry having other characteristic impedances. In addition, the circuit described may be equivalently implemented by methods known to those skilled in the art in a balanced configuration.

A through microstrip transmission line 11303 includes the first terminal coupled to a first node 11104 coupled to a first terminal of a DC blocking capacitor 11200. DC blocking capacitor 11200 includes a second terminal coupled to a node 11103 of a microstrip transmission line matching structure 11300. Microstrip transmission line matching structure 11300 includes an input terminal 11100, and a third node coupled to a first terminal of an open stub microstrip 11301. The open stub microstrip 11301 includes a second terminal coupled to an open stub node 11102. Open stub microstrip line 11301 is coupled to microstrip line 11300 at node 101 such that a T-junction is formed.

A second terminal of microstrip through line 11303, forms a node 11125. Node 11125 is coupled to a first terminal of a DC blocking capacitor 11209. A second terminal DC blocking capacitor 11209 is coupled to an input terminal of an impedance matching microstrip circuit 11126. The impedance matching circuit 11126 includes a microstrip transmission line 11304 having the first terminal coupled to node 11126 and the second terminal 11129 that forms an output port. A third node 11127 of transmission line 11304 is coupled to a first terminal of an open stub microstrip transmission line 11305. A second terminal of open stub microstrip transmission line 11305 is coupled to an open stub node 11128.

A third node of microstrip through line 11303 is coupled to a first terminal of a varactor diode 11203, at node 11112. A second terminal of a varactor diode 11203 is coupled to a ground connection.

A fourth terminal of through transmission line 11303 forms node 11105. The node forms a T-junction in the microstrip and is coupled to a first terminal 11106 of resistor 11201. Resistor 11201 includes a second terminal coupled to a first terminal 11107 of a transmission line junction that forms node 11108. A second terminal of the transmission line junction forms node 11110. Node 11110 is coupled to a first terminal of a bypass capacitor 11202. A second terminal of bypass capacitor 11202 is coupled to ground at node 11111. A third terminal of a transmission line junction forms node 11302 which is coupled to an input signal pad 11109.

A fifth terminal of microstrip through transmission line 11303 is located at a node 11113 along its length. Node 11112 is coupled to a first terminal of a DC blocking capacitor 11204. A second terminal of DC blocking capacitor 11204 is coupled to a first terminal of a T-shaped microstrip structure 11115. T-shaped microstrip structure 11115 is constructed utilizing methods known to those skilled in the art.

A second terminal of the T-shaped microstrip structure 11115 forms node 11118. Node 11118 is coupled to a first terminal of a resistor 11205. A second terminal of resistor 11205 is coupled to a node 11119.

Node 11119 is a first terminal of a pad structure that includes a second terminal, or node 11120 and a third terminal coupled to a first terminal of a microstrip line 11306. Microstrip line 11306 includes a second terminal coupled to a signal input pad 11122. Node 11120 is coupled to a first terminal of a bypass capacitor 11206. A second terminal of bypass capacitor 11206 is coupled to ground at node 11121.

A third terminal of T-shaped microstrip structure 11115 is coupled to a node 11116. Node 11116 is coupled to a first terminal of an inductor 11207. Inductor 11207 is a surface mounted thick film inductor, of an appropriate value for the frequencies of interests. Equivalently, other types of inductors may be used in place of a thick film inductor. A second terminal of inductor 11207 is coupled to a node 11117. The node 11117 is a first terminal of pad 11123. A second terminal of pad 11123 is coupled to a first terminal of a varactor diode 11208. A second terminal of varactor diode 11208 is coupled to ground at pad 11124.

In the embodiments shown values for the capacitors, resistors, inductors, quarter wavelength transmission lines and microstrip lines are chosen utilizing methods known to those skilled in the art to yield an appropriate electrical response for a frequency, or band of frequencies, over which the group delay adjusting circuit operates. The values chosen for resistors 11201 and 11205 achieve a dual purpose. Resistors 11201 and 11205 provide a high RF impedance DC connection that blocks RF signals, and provides a current limiting function to set an appropriate bias in a corresponding varactor diode. As in the first embodiment, this single ended circuit may be equivalently constructed as a balanced circuit, and cascaded with identical or similar group delay circuits to achieve an overall desired response.

What is claimed is:

1. A group delay adjusting circuit comprising:
   a first stub matching structure coupled to a microstrip input transmission line;
   a first DC blocking capacitor having a first terminal coupled to the microstrip input transmission line, and a second terminal;
   a main transmission line having a first terminal coupled to the second terminal of the first DC blocking capacitor, a second terminal, a third terminal along its length, a fourth terminal along its length, and a fifth terminl along its length;
   a first varactor diode having a first terminal coupled to the fifth terminal of the main transmission line, and a second terminal coupled to a ground;
   a first high impedence line having a first terminal coupled to the third terminal of the main transmission line, and a second terminal;
   a first RF by pass capacitor having a first terminal coupled to the second terminal of the first high impedance line and a first signal input pad, and a second terminal coupled to ground;
   a second DC blocking capacitor having a first terminal coupled to the second terminal of the main transmission line, and a second terminal;
   a second stub matching structure coupled to a microstrip output transmission line, and to the second terminal of the second DC blocking capacitor;
   a third DC blocking capacitor having a first terminal coupled to the fourth terminal of the main transmission line, and a second terminal;
   a transmission line of a quarter wavelength at a frequency of operation having a first terminal at a first end coupled to the second terminal to the third DC blocking capacitor, a second terminal at a second end, and a third terminal along its length;
   a second varactor diode having a first terminal coupled to the second terminal of the transmission line of a quarter wavelength at a frequency of operation, and a second terminal coupled to the ground;
   a second high impedance transmission line having a first terminal coupled to the third terminal of the transmission line of a quarter wavelength at a frequency of operation, and a second terminal; and
   a second RF bypass capacitor having a first terminal coupled to the second terminal of the high impedance transmission line and to a second signal input pad, and a second terminal coupled to the ground.

2. A group delay adjusting circuit comprising:
   a first stub matching structure coupled to a microstrip input transmission line;
   a first DC blocking capacitor having a first terminal coupled to the microstrip input transmission line, and a second terminal;
   a main transmission line having a first terminal coupled to the second terminal of the first DC blocking capacitor, a second terminal, a third terminal along its length, a fourth terminal along its length, and a fifth terminal along its length;
   a first varactor diode having a first terminal coupled to the fifth terminal of the main transmission line, and a second terminal coupled to a ground;
   a second DC blocking capacitor having a first terminal coupled to the third terminal of the main transmission line, and having a second terminal;
   a second stub matching structure coupled to the second terminal of the second DC blocking capacitor;
   a third DC blocking capacitor having a first terminal coupled to the fourth terminal of the main transmission line, and having a second terminal;
   a T-shaped microstrip structure having a first terminal coupled to the second terminal of the third DC blocking capacitor, a second terminal and a third terminal;
   a first resistor having a first terminal coupled to the second terminal of the T-shaped microstrip structure, and a second terminal;
   a first RF by pass capacitor having a first terminal coupled to the second terminal of the first resistor and a first signal input pad, and having a second terminal coupled to ground;
   an inductor having a first terminal coupled to the third terminal of the T-shaped microstrip structure and having a second terminal;
   a second varactor diode having a first terminal coupled to the second terminal of the inductor, and a second terminal coupled to the ground;
   a second resistor having a first terminal coupled to the fifth terminal of the microstrip output transmission line, and having a second terminal; and
   a second RF bypass capacitor having a first terminal coupled to the second terminal of the second resistor and to a second signal input pad, and having a second terminal coupled to the ground.

3. A method of adjusting a group delay adjusting circuit comprising:
   applying a signal to the group delay adjusting circuit
   applying a capacitive control signal to adjust a first variable capacitance;

adjusting the first variable capacitance by applying the capacitive control signal to the first variable capacitance;

applying an inductive control signal to a second variable capacitance; and adjusting the second variable capacitance by applying the inductive control signal to the second variable capacitance measuring a group delay of the signal prior to the step of adjusting the first variable capacitance.

4. A variable inductance circuit comprising a virtual inductor; and a bias network coupled to the virtual inductor, wherein the bias network comprises:

a series impedance including a first terminal coupled to the quarter wavelength transmission line at a high impedance point and a second terminal coupled to an inductive control signal;

a first shunt capacitance having a first terminal coupled to the second terminal of the transmission line, and a second terminal coupled to a ground.

5. The variable inductance of claim 4, wherein the series impedance comprises a high impedance transmission line.

6. The variable inductance of claim 4, further comprising second capacitor having a first terminal coupled to a point on the high impedance transmission line, and a second terminal coupled to ground.

7. The variable inductance of claim 6, wherein the high impedance transmission line is a microstrip transmission line.

8. The variable inductance of claim 7, wherein the high impedance transmission line is a coaxial transmission line.

9. The variable inductance of claim 4, wherein the series impedance comprises a series inductance.

10. The variable inductance of claim 4, wherein the series impedance comprises a wire having a ferrite bead disposed about the wire.

11. The variable inductance of claim 4, wherein the inductive control signal is a voltage.

* * * * *